United States Patent [19]

Andrews

[11] 3,967,140

[45] June 29, 1976

[54] TUNNEL DIODE PULSE GENERATOR

[75] Inventor: James R. Andrews, Lafayette, Colo.

[73] Assignee: The United States of America as represented by the Secretary of Commerce, Washington, D.C.

[22] Filed: Jan. 13, 1975

[21] Appl. No.: 540,471

[52] U.S. Cl. ................................ 307/286; 307/282; 307/322; 333/10

[51] Int. Cl.² ........................................ H03K 3/315

[58] Field of Search.................... 307/282, 322, 286; 333/10

[56] References Cited

UNITED STATES PATENTS

| | | | |
|---|---|---|---|
| 3,451,005 | 6/1969 | Skullestad | 307/322 X |
| 3,474,348 | 10/1969 | Cohen | 307/322 X |
| 3,510,690 | 5/1970 | Kawabata | 307/286 X |
| 3,558,930 | 1/1971 | Knapton | 307/286 |

*Primary Examiner*—John S. Heyman
*Attorney, Agent, or Firm*—Eugene J. Pawlikowski; David Robbins; Alvin Englert

[57] ABSTRACT

A tunnel diode pulse generator is triggered through a directional coupler. The tunnel diode is coupled across one end of an output transmission line through an impedance matching network which matches the characteristic impedance of the transmission line. Triggering signals are coupled to the transmission line through the directional coupler for propagation of triggering impulses towards the tunnel diode.

7 Claims, 9 Drawing Figures

FIG. 1
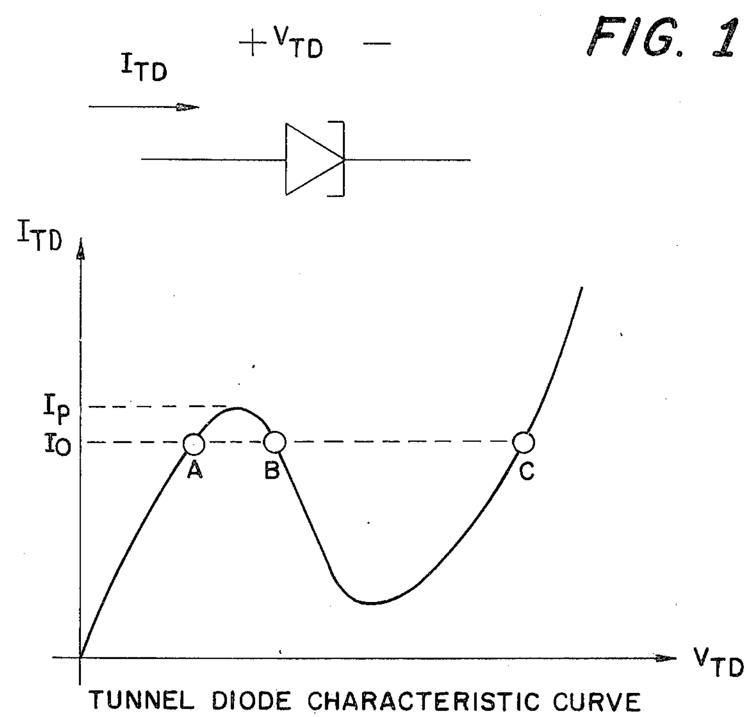
TUNNEL DIODE CHARACTERISTIC CURVE
FIG. 2A
FIG. 2B
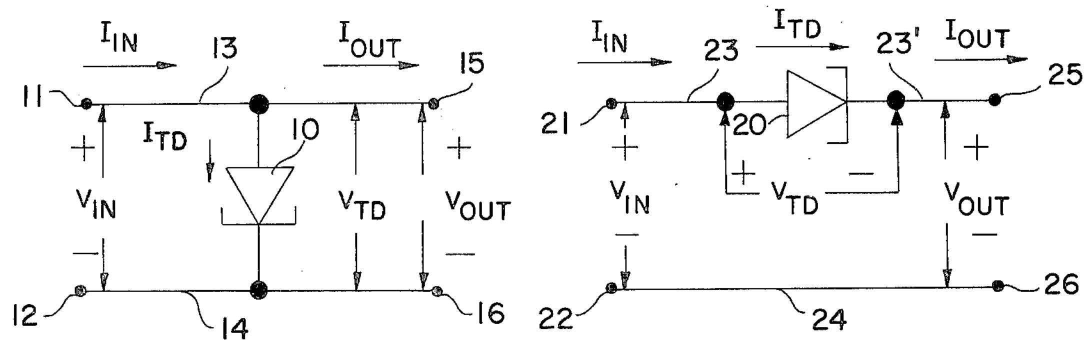

NBS
TUNNEL DIODE
BIAS SUPPLY
130
131
TUNNEL DIODE MOUNT
150
144
151
152
153
154
155
160
161
162
163
156
170
$Z_{IN} = 50\Omega$
181
182
DIRECTIONAL COUPLER
172
171
180
171
$Z_{GEN} = 50\Omega$
(FIG.8)
183

BIAS SUPPLY
30
31
32
33
34
36
37
38
40
CABLE
PRIOR ART
72
(FIG.5)
42
44
TUNNEL DIODE MOUNT
50
51
52
53
54
55
60
6dB
61
62
63
56
PULSE
OUTPUT
(FIGS.
6&7)
70
TRIGGER
INPUT

TUNNEL DIODE PULSE GENERATOR

BACKGROUND OF THE INVENTION

This invention relates to a tunnel diode pulse generator and, more particularly, to a technique for triggering a tunnel diode.

Since the tunnel diode is one of the fastest electronic devices known, it is widely used for ultrafast time domain pulse measurements and applications. In such applications, the tunnel diode is used as a pulse generator to produce a step-like waveform. However, the tunnel diode is a two terminal device; and this leads to a number of problems. There is no input/output isolation. In shunt connections, whatever input voltage is present also appears in the output; and in series connections the input and output currents are equal. It is therefore difficult, in pulse generator applications, to isolate the trigger signal from the desired step-like transition, with the result that the trigger pulse causes distortions in the flatness of the pulse baseline and topline immediately before and after the fast pulse transition.

In typical prior art tunnel diode pulse generator circuit designs, the triggering impulse is added to the d.c. bias. When the triggering impulse strikes the tunnel diode, it then continues out on the output line. When the tunnel diode switches, a step transition is generated and propagates in both directions. Thus, the output signal propagating on the output line consists of the algebraic sum of the tunnel diode transition, which is desired, and the triggering impulse, which is not desired, resulting in the aforementioned distortions of the pulse baseline and topline.

The only commercial tunnel diode pulse generator solving the baseline-topline distortion problem employs a balanced differential capacitance probe arrangement for triggering the tunnel diode. However, this results in a 70 picosecond risetime which is too slow for many ultrafast pulse applications.

SUMMARY OF THE INVENTION

It is accordingly an object of the invention to provide an improved tunnel diode pulse generator which overcomes the aforementioned problems.

More specifically, it is an object of the invention to provide an improved triggering technique for a tunnel diode.

Briefly, according to the invention, the triggering signal is coupled to the tunnel diode through a directional coupler. The tunnel diode is connected across one end of an output transmission line by means of an impedance matching network which matches the characteristic impedance of the transmission line. The triggering signal, which is a step signal, is coupled by the directional coupler to the output transmission line to propagate in the form of a triggering impulse in the direction of the tunnel diode. Since the impedance of the transmission line is matched by the impedance matching network, the triggering impulse is not reflected back down the transmission line. Thus, when the tunnel diode switches in response to the triggering impulse, it generates a step transition output signal which is propagated out the transmission line without the baseline and topline distortion heretofore provided by the triggering impulse.

These and other objects, features, and advantages of the invention will become more readily apparent from consideration of the following detailed description of a preferred embodiment of the invention along with the accompanying drawings.

BRIEF DESCRIPTION OF THE DRAWINGS

FIG. 1 is a diagram showing a tunnel diode characteristic curve;

FIG. 2A is a schematic diagram showing a tunnel diode in shunt connection;

FIG. 2B is a schematic diagram showing a tunnel diode in series connection;

DETAILED DESCRIPTION

Figure 4:
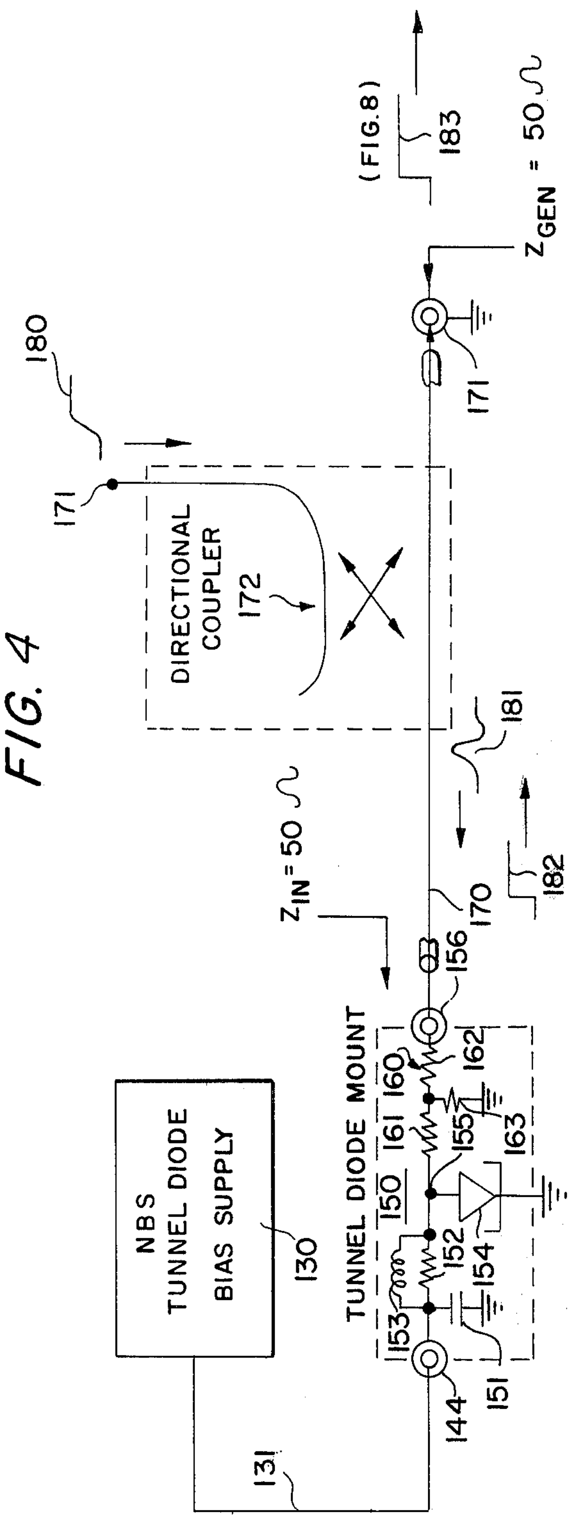
FIG. 4 is a schematic diagram of a preferred embodiment of the invention.

The tunnel diode is capable of generating voltage transitions with a 10–90% transition time (also called risetime) of the order of 15 picoseconds ($15 \times 10^{-12}$ seconds). The tunnel diode therefore has wide applicability in ultrafast (< 1 nanosecond) time domain pulse measurements and applications in which the tunnel diode is used as a pulse generator producing a step-like waveform.

As is seen from the characteristic current-voltage curve of FIG. 1, the tunnel diode is a bistable device. At a fixed current $I_o$ there are three possible voltage states A, B, or C. A and C are stable states, but B is in a negative resistance region of the characteristic and is potentially unstable. Normally, the tunnel diode is biased to State A. For triggering the tunnel diode, a small amount of trigger current is added to $I_o$ to exceed the tunnel diode's peak current $I_p$. When this occurs, the tunnel diode rapidly switches to its other stable state C. Thus, the tunnel diode is capable of generating a step transition from a first voltage corresponding with the voltage of state A and a second voltage corresponding with the voltage of state C.

Since the tunnel diode is a two terminal device, a number of problems arise. As shown in FIGS. 2A and 2B, there is no input/output isolation. The shunt connection is shown in FIG. 2A. The tunnel diode 10 is connected in shunt between lines 13 and 14. The input voltage $V_{IN}$ across input terminals 11 and 12 is identical to the voltage $V_{TD}$ across the tunnel diode itself and the output voltage $V_{OUT}$ across output terminals 15 and 16. Thus, whatever input voltage is present, also appears on the output. This is not true of the current, since the input current $I_{IN}$ is divided between the current through the tunnel diode $I_{TD}$ and the output current $I_{OUT}$.

The series connection is shown in FIG. 2B. Here, the tunnel diode 20 is connected in series between an input terminal 21 and an output terminal 25 between line sections 23 and 23'. The other input terminal 22 and the other output terminal 26 are connected directly by a line 24. Thus, the input current $I_{IN}$ must be identical to the current $I_{TD}$ through the tunnel diode 20 and the output current $I_{OUT}$. The input voltage $V_{IN}$ differs, however, from the voltage across the tunnel diode $V_{TD}$ and the output voltage $V_{OUT}$.

It is thus apparent, that in pulse generator applications, it is difficult to isolate the trigger signal from the desired step-like transition output signal. The trigger pulse causes distortions in the flatness of the pulse baseline and topline immediately before and after the fast pulse transition.

Figure 3:
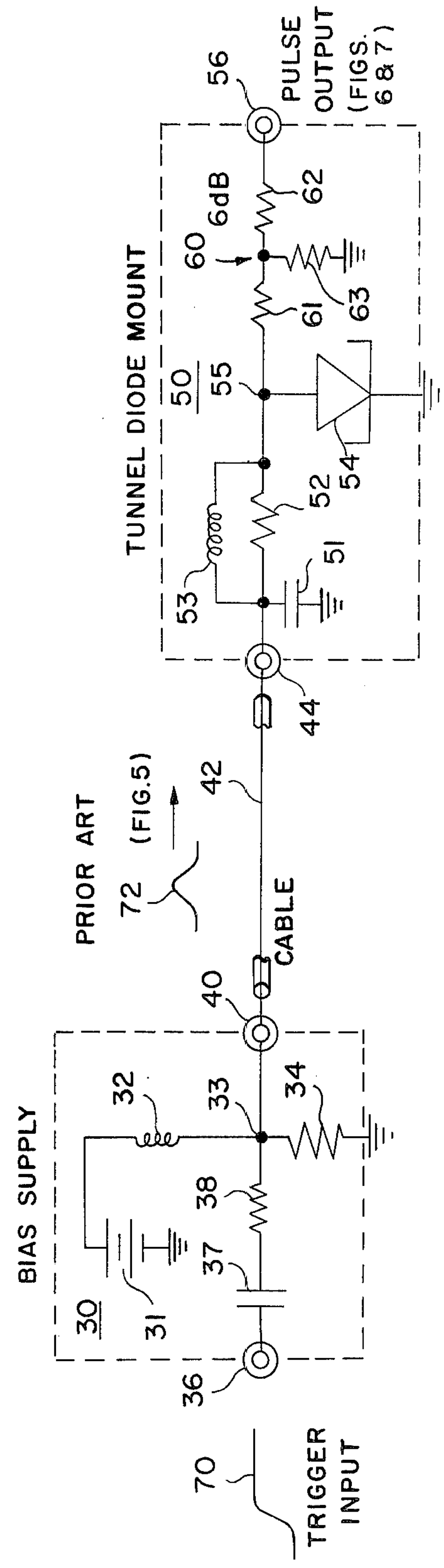
FIG. 3 is a schematic diagram of a prior art tunnel diode pulse generator.

A typical prior art commercial tunnel diode pulse generator is shown in FIG. 3. This pulse generator, which corresponds to the Hewlett-Packard HP-1106A, is the most commonly used tunnel diode at present for a risetime transfer standard ($t_r$~ 20 picoseconds) between the National Bureau of Standards and the service laboratories. It is also typical of most tunnel diode pulse generator circuit designs. Generally speaking, the prior art pulse generator comprises a bias supply 30 which includes an input connector 36 for receiving a trigger input signal 70. The bias supply is coupled through a coaxial cable 42 to a tunnel diode mount 50 which includes a shunt connected tunnel diode 54. More particularly, the bias supply 30, which typically will be the Hewlett-Packard HP-1105A bias supply, includes, as a source of direct current voltage, a battery 31, which is coupled through a choke coil 32 to a junction point 33. The trigger input signal 70 is coupled from connector 36 through a differentiating capacitor 37, which may have a value of 20 pF., and a resistor 38, which may have a value of 200 ohms. A shunt resistor 34 is connected between junction point 33 and a point of reference potential and may have a value of 50 ohms. The combined bias and trigger input signal is coupled from an output connecgtor 40 of the bias supply through coaxial cable 42 to an input connector 44 of the tunnel diode mount 50.

Tunnel diode mount 50 includes a low pass filter circuit comprising an input shunt capacitor 51 and a series resistor 52 and an inductor 53 in parallel connecting input connector 44 to a junction point 55 from which tunnel diode 54 is connected to a point of reference potential. The output side of tunnel diode 54 is coupled through a 6dB. impedance matching network 60. Network 60 is a T-network having a pair of series arms 61 and 62 and a shunt arm 63. Network 60 serves to connect tunnel diode 54 across output connector 56 from which the pulse output is taken. connector In the operation of the prior art device of FIG. 3, the input trigger signal 70 is differentiated by capacitor 37 into a + 150 mV., 1 nanosecond impulse 72. This trigger impulse is added onto the d.c. bias, and the bias and trigger impulse are sent through cable 42 to the HP-1106A tunnel diode mount 50. The trigger impulse is passed through the low pass filter consisting of capacitor 51, resistor 52, and inductor 53 to tunnel diode 54, causing it to rapidly switch to its high voltage state. The baseline/topline problem arises at this point. The triggering impulse 72 propagates to the right, as shown in FIG. 3, strikes the tunnel diode, and then continues to the right on the output line connected to output connector 56. When the tunnel diode switches, it generates a step transition which propagates to the right and the left. Thus, the output signal propagating to the right from pulse output connector 56 consists of the algebraic sum of the tunnel diode step transition and the triggering impulse, which provides the distortion to the baseline and topline.

Figure 5:
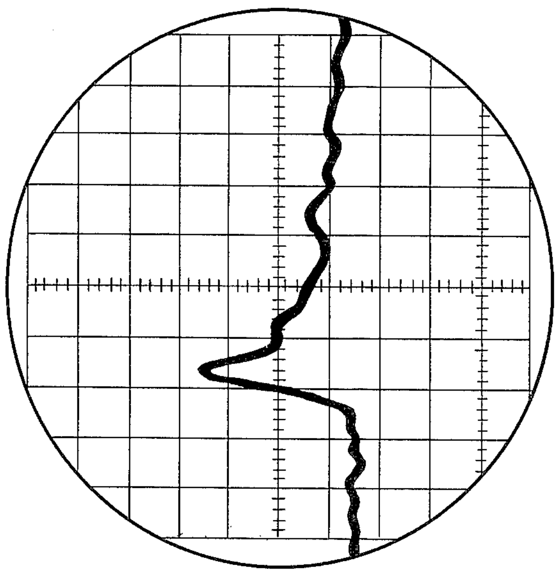
FIG. 5 is an oscilloscope trace showing the triggering impulse on the interconnecting cable of the prior art device.
Figure 6:
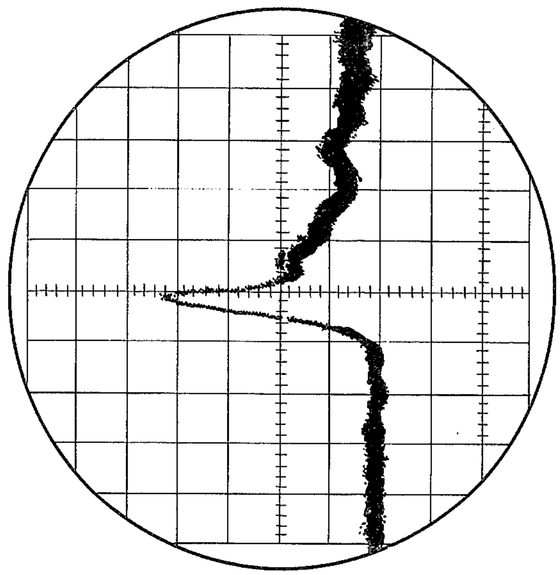
FIG. 6 is an oscilloscope trace of the triggering impulse after passing through the tunnel diode mount of the prior art device.
Figure 7:
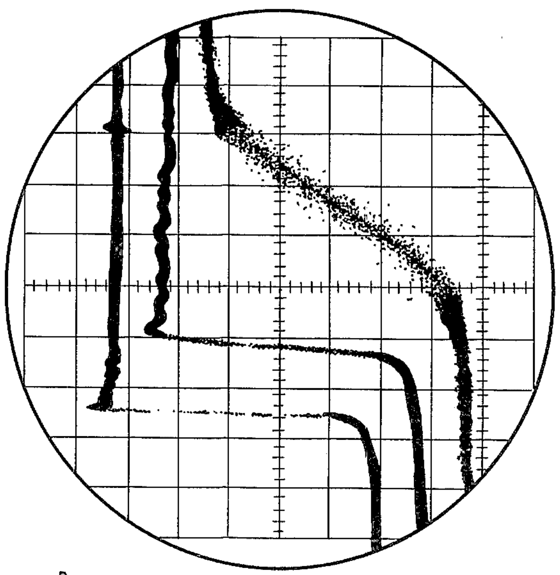
FIG. 7 is an oscilloscope trace of the normal pulse output of the prior art device.

FIG. 5 is an oscilloscope trace showing the triggering impulse 72 as it appears on cable 42. It is to be observed that in the vertical dimension, the scale is 50 mV./cm.; and in the horizontal dimension, the scale is 1 nanosecond/cm. FIG. 6 is an oscilloscope trace of the triggering impulse 72 after it passes through the HP-1106A tunnel diode mount 50 with the bias set low enough to prevent tunnel diode triggering. Here, the vertical scale is 5 mV./cm.; and the horizontal scale is 1 nanosecond/cm. FIG. 7 is an oscilloscope trace of the normal pulse output of the HP-1106A tunnel diode mount in which the bias has been set for minimum jitter. The vertical scale is set at 50 mV./cm.; and the horizontal scale from top to bottom is set as follows: 500 picoseconds/cm., 100 picoseconds/cm., and 10 picoseconds/cm. This shows the composite tunnel diode step and triggering impulse. It will be observed from FIG. 7 that there is distortion in the baseline and topline. From the standpoint of precise 10–90% transition time measurements, the perturbed baseline and topline are very objectionable. To precisely determine the 10 and 90% points, it is first necessary to determine the 0 and 100% levels. Practically all other pulse parameters are also referenced to the 0 and 100% levels. In the past, considerable human judgement (always subject to error) has been required to extrapolate the 0 and 100% levels from results such as those shown in FIG. 7.

A preferred embodiment of the present invention is shown in FIG. 4. According to the invention, the triggering impulse is no longer provided through the bias supply 130, but rather is coupled to an output transmission line 170 by means of a directional coupler 172.

As is seen in FIG. 4, the bias supply 130, which is a National Bureau of Standards tunnel diode bias supply, is coupled by means of a bias line 131 to the input connector 144 of a tunnel diode mount 150. In general, the tunnel diode mount 150 resembles the tunnel diode mount 50 of the prior art embodiment of FIG. 3. A low pass filter, consisting of a shunt capacitor 151, and a series resistor 152 and inductor 153 in parallel, couples input connector 144 to a junction point 155. The tunnel diode 154 is connected in shunt from junction point 155 to a point of reference potential. The tunnel diode is connected across the end of output transmission line 170 by means of a 6dB. impedance matching network 160 which includes a pair of series resistors 161 and 162 and a shunt resistor 163, forming a T-network, connecting junction point 155 to output connector 156. The impedance matching network matches the 50 ohm characteristic impedance of the output coaxial line 170, the other end of which is connected to an output connector 171. As indicated on FIG. 4, the output impedance of the tunnel diode pulse generator is also 50 ohms.

The trigger signal 180, which as shown in FIG. 4 is a step transition signal, is applied to a trigger input terminal 171 and is coupled by means of directional coupler 172 to the output transmission line 170 for propagation in the direction of tunnel diode 154. The trigger step signal is transformed by the directional coupler into the form of a triggering impulse 181. If the directional coupler is perfect (with infinite directivity), none of the triggering impulse will propagate toward output connector 171. Triggering impulse 181 enters tunnel diode mount 150 through output connector 156, first encountering the 6dB. impedance matching network 160 and then tunnel diode 154. Since the impedance matching network 160 matches the impedance of transmission line 170, triggering impulse 181 is completely absorbed within tunnel diode mount 150. Thus, none of the triggering impulse is reflected to appear at output connector 171. When the tunnel diode is triggered, it generates its fast step transition as before. This fast step output signal 182 propagates down output transmission line 170 toward output connector 171. Since none of the triggering impulse 181 has been reflected to output connector 171, only the step signal 182 will appear in output signal 183.

Figure 8:
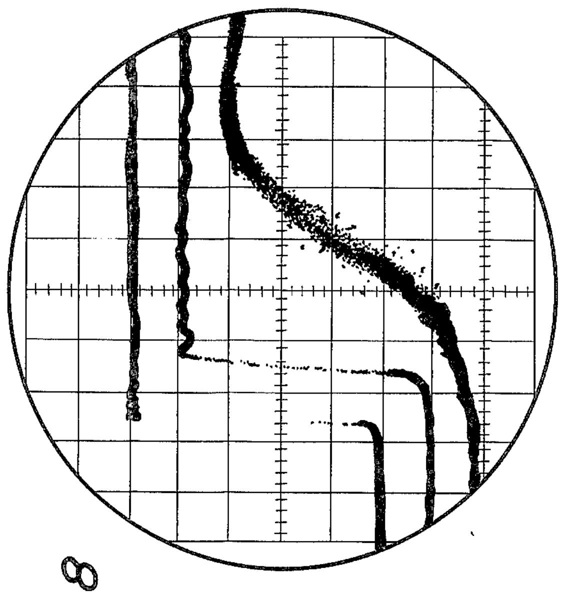
FIG. 8 is an oscilloscope trace showing the output from the embodiment of FIG. 4.

The feasibility of the invention has been demonstrated by assembling the setup shown in FIG. 4 and subjecting it to the same tests as were applied to the prior art device of FIG. 3. FIG. 8 is an oscilloscope trace showing the results obtained. A vertical scale of 50 mV./cm. is used in the trace of FIG. 8. The horizontal scale, from top to bottom, is as follows: 500 picoseconds/cm., 100 picoseconds/cm., and 10 picoseconds/cm. As will be readily apparent from a comparison of the oscilloscope trace of FIG. 8 with the oscilloscope trace of FIG. 7, the baseline/topline perturbations have been markedly reduced. It is now much easier to define the 0 and 100% levels in FIG. 8 as compared with the error prone determination of these levels necessary with the trace of FIG. 7. This result is achieved without a significant sacrifice in speed; a transition time of the order of 15 picoseconds is maintained.

While a preferred embodiment of the invention has been shown and described, it will be apparent to those skilled in the art that changes can be made without departing from the principles and spirit of the invention, the scope of which is defined in the appended claims.

The invention claimed is:

1. A tunnel diode pulse generator, comprising:
a transmission line;
a tunnel diode;
bias means biasing said tunnel diode;
means connecting said tunnel diode across said transmission line, said means including an impedance matching network matching the characteristic impedance of said transmission line;
means supplying triggering signals; and
directional coupler means for coupling said triggering signals to said transmission line for transmission towards said tunnel diode, said triggering signal being received by said means connecting said tunnel diode without reflection and said triggering signal triggering said tunnel diode to generate an output signal which propagates down said transmission line from said tunnel diode.

2. A tunnel diode pulse generator, as recited in claim 1, wherein said means biasing said tunnel diode is coupled to said tunnel diode from a side of said tunnel diode opposite to said impedance matching network.

3. A tunnel diode pulse generator, as recited in claim 1, wherein said transmission line comprises an output terminal at an end of said transmission line opposite to the end of said transmission line connected to said tunnel diode, said output signal being propagated to said output terminal.

4. A tunnel diode pulse generator, as recited in claim 1, wherein said means connecting said tunnel diode comprises a tunnel diode mount including a first connector and a second connector, said impedance matching network being connected between said tunnel diode and said first connector, said bias means being coupled to said tunnel diode through said second connector and said transmission line being coupled to said tunnel diode through said first connector.

5. A tunnel diode pulse generator, as recited in claim 1, wherein said triggering signals comprise step signals, said step signals being formed into triggering impulses upon passing through said directional coupler means.

6. A tunnel diode pulse generator, as recited in claim 5, wherein said output signal is a fast step transition signal.

7. A tunnel diode pulse generator, as recited in claim 1, wherein said output signal is a fast step transition signal.

* * * * *